United States Patent [19]
Chern

[11] Patent Number: 5,182,529
[45] Date of Patent: Jan. 26, 1993

[54] ZERO CROSSING-CURRENT RING OSCILLATOR FOR SUBSTRATE CHARGE PUMP

[75] Inventor: Wen-Foo Chern, Colorado Springs, Colo.

[73] Assignee: Micron Technology, Inc., Boise, Id.

[21] Appl. No.: 847,331

[22] Filed: Mar. 6, 1992

[51] Int. Cl.[5] .................... H03P 5/02; H03K 3/354
[52] U.S. Cl. .................... 331/57; 307/296.2
[58] Field of Search .................... 331/57, DIG. 3; 307/296.2

[56] References Cited

U.S. PATENT DOCUMENTS 3,350,659 10/1967 Henn .................... 331/57
4,705,966 11/1987 Van Zanten .................... 307/296.2

Primary Examiner—Siegfried H. Grimm
Attorney, Agent, or Firm—Marger, Johnson, McCollom & Stolowitz

[57] ABSTRACT

A ring oscillator for use with a charge pump includes an odd number of inverter stages each having a primary input, a secondary input, and an output. Both inputs are switched to the same logic state to invert the logic signal at the output of the inverter stage. No crossing-current flows within the inverter stage if the inputs have different logic states. The output of each inverter stage is coupled to the primary input of a following inverter stage in a serially-connected ring fashion. The output of a last inverter stage is coupled to the primary input of a first inverter stage and forms an oscillating signal output, which is coupled to the charge pump. The secondary input of each stage is coupled to the output of a preceding inverter stage. The preceding inverter precedes the current inverter by an odd integer greater or equal to three. The ring oscillator includes a transistor coupled to the output of each inverter stage for impressing a initial pattern of alternating logic levels to begin the oscillation.

20 Claims, 7 Drawing Sheets

ZERO CROSSING-CURRENT RING OSCILLATOR FOR SUBSTRATE CHARGE PUMP

BACKGROUND OF THE INVENTION

This invention relates generally to charge pumps for maintaining a constant voltage bias on the substrate of an integrated circuit, and, more particularly, to a substrate pump having reduced power requirements by eliminating the crossing-current in the gates of the ring oscillator used in conjunction with the charge pump.

A typical charge pump system 10 is shown in FIG. 1, including a ring oscillator 12 for providing a square-wave oscillating signal to a charge pump 14. The charge pump 14, which is coupled between a positive supply voltage and ground, usually includes two diodes and a capacitor for converting the square-wave oscillating signal into a negative voltage, although other more sophisticated circuits exist. The negative voltage is provided at output 16 for driving the substrate of an integrated circuit in the absence of an external source of negative supply voltage. In the alternative, substrate pump 14 is sometimes configured to provide a voltage higher than the most positive supply voltage for driving isolated wells on the integrated circuit. The ring oscillator 12 includes an odd number of inverter stages 101–113 arranged in a serially-connected ring fashion. Thirteen inverter stages are shown in FIG. 1, but the exact number can be any odd number depending upon the delay through each stage and the desired oscillating frequency. The "X" output of each inverter is coupled to the "A" input of a succeeding inverter in the ring. The output of the last inverter 113 is coupled to the input of the first inverter 101 to form the oscillating output, which is in turn coupled to the input of the charge pump 14.

A typical prior art inverter stage 100 is shown in the schematic diagram of FIG. 2. Inverter stage 100 includes a P-channel transistor Q1 and an N-channel transistor Q2. The gates of transistors Q1 and Q2 are coupled together to form the A input at node 20 and the drain of transistors Q1 and Q2 are coupled together to form the inverted X output at node 22. Power for the inverter is supplied by a source of positive voltage VDD, usually five volts, at node 24. Node 24 is also the source of transistor Q1. The source of transistor Q2 is coupled to ground or a second voltage source VSS at node 26. The exact values of the power supplies VDD and VSS are determined by the level of logic swings required and the physical dimensions of the transistors, among other factors.

Another prior art inverter stage 100' is shown in the schematic diagram of FIG. 3. Inverter stage 100' again includes P-channel transistor Q1 and an N-channel transistor Q2, and in the same configuration, except for the source connections. The source of transistor Q1 is coupled through an additional P-channel load transistor Q3 to VDD, while the source of transistor Q2 is coupled through an additional N-channel load transistor to VSS. The extra transistors of inverter stage 100' enable the designer to adjust channel dimensions for minimum parasitic output capacitance at node 22. For example, the channel length of transistors Q3 and Q4 can be made quite large, minimizing power requirements and decreasing inverter gain. The channel width and length of transistors Q1 and Q2 can be made quite small to minimize parasitic drain capacitance. Transistor Q3 is biased on with bias voltage VBIAS1 at node 27, while transistor Q4 is biased on with bias voltage VBIAS2 at node 29.

Inverters 100 and 100' both exhibit undesirable "crossing-current". This term refers to the characteristic of the inverter whereby current flows directly from VDD to VSS through the transistors Q1–Q2 or Q1–Q4 during an edge transition of the input signal. Referring now to FIG. 4, a portion of the square-wave oscillating signal is shown having GND and VDD logic levels. The oscillating signal and operation of the inverters are divided into three zones. If the input signal is less than the threshold voltage $V_{TN}$ of transistor Q2, current is directed from VDD through output node 22 into the load and transistor Q1 is off. If the input signal is greater than VDD minus the threshold voltage $V_{TP}$ of transistor Q1, current is directed from the load through output node 22 to VSS and transistor Q2 is off. If the input signal is between $V_{TN}$ and $VDD - V_{TP}$, transistors Q1 and Q2 are both on, and an undesirable crossing-current component flows from VDD to VSS. The current, which can be made small in a single inverter, is nonetheless significant if multiplied by the number of inverters required in the ring oscillator 12. The total current, multiplied by the difference in voltage between the VDD and VSS power supplies, represents a significant amount of wasted power consumption in the charge pump system 10.

Accordingly, a need remains for a charge pump system in which the power consumption due to crossing-current in the inverter stages of the ring oscillator is minimized or even eliminated.

SUMMARY OF THE INVENTION

It is, therefore, a principal object of the invention to conserve power consumption in charge pump systems.

It is a further object of the invention to provide a novel low-power ring oscillator configuration.

According to the present invention, a ring oscillator for use with a charge pump includes an odd number of inverter stages each having a primary input, a secondary input, and an output. Both inputs are switched to the same logic state to invert the logic signal at the output of the inverter stage. No crossing- current flows within the inverter stage if the inputs have different logic states. The output of each inverter stage is coupled to the primary input of a following inverter stage in a serially-connected ring fashion. The output of a last inverter stage is coupled to the primary input of a first inverter stage and forms an oscillating signal output, which is coupled to the charge pump. The secondary input of each stage is coupled to the output of a preceding inverter stage. The preceding inverter precedes the current inverter by an odd integer greater or equal to three. The ring oscillator includes a transistor coupled to the output of each inverter stage for impressing an initial pattern of alternating logic levels to begin the oscillation.

In the preferred embodiment, each inverter stage includes first and second P-channel transistors and first and second N-channel transistors coupled in series between first and second sources of supply voltage. The gates of the first P-channel and N-channel transistors are coupled together to form the primary input, and the drains of the first P-channel and N-channel transistors being coupled together to form the output. The gates of the second P-channel and N-channel transistors are coupled together to form the secondary input. If desired, the inverter further can include high channel resistance first and second transistor loads. The resistance of each transistor load is determined through the use of appropriate gate bias voltages.

The foregoing and other objects, features and advantages of the invention will become more readily apparent from the following detailed description of a preferred embodiment of the invention which proceeds with reference to the accompanying drawings.

DETAILED DESCRIPTION

Figure 5:
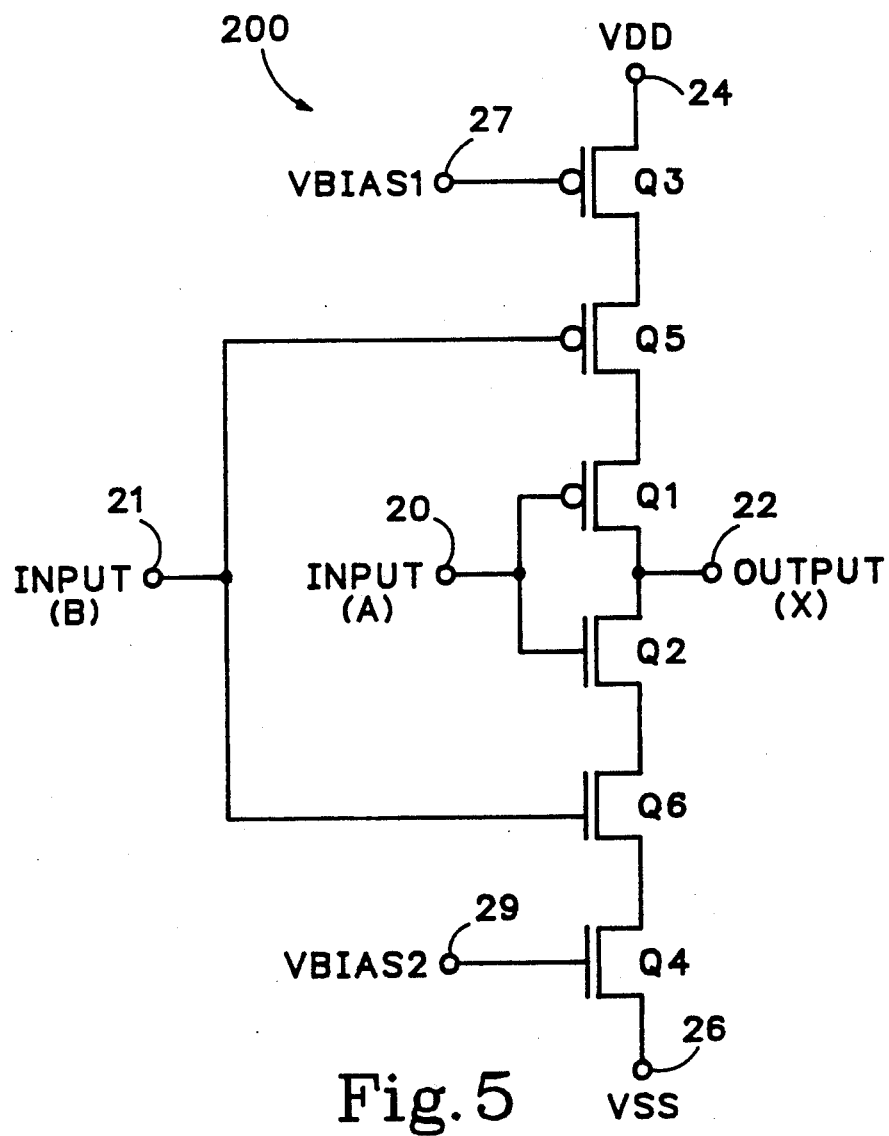
FIG. 5 is a schematic diagram of an inverter for use in a ring oscillator according to the present invention.

Referring now to FIG. 5, an inverter stage 200 used in the ring oscillator of the present invention inverts the logic signal at the output node 22 if both the primary and secondary inputs 20 and 21 are switched from a first logic state to a second logic state. The inverter stage 200 inhibits crossing-current (current flow between VDD and VSS) if the primary and secondary inputs 20 and 21 are at different logic states. In operation, if inverter 200 is switched from a condition wherein the primary and secondary inputs are at different logic states to a condition wherein the primary and secondary inputs are at the same logic state, current can only flow into or out of the load, and no zero crossing current flows within the inverter.

Inverter stage 200 includes a first P-channel transistor Q1 and a first N-channel transistor Q2. The gates of the first P-channel and N-channel transistors Q1 and Q2 are coupled together to form the primary "A" input at node 20. The drains of the first P-channel and N-channel transistors Q1 and Q2 are coupled together to form the "X" output at node 22. A second P-channel transistor Q5 has a drain coupled to the source of the first P-channel transistor Q1, and a source coupled (through P-channel load transistor Q3) to the supply voltage VDD. A second N-channel transistor Q6 has a drain coupled to the source of the first N-channel transistor Q2, and a source coupled (through N-channel load transistor Q4) to the supply voltage VSS. The gates of the second P-channel and N-channel transistors Q5 and Q6 are coupled together to form the secondary "B" input at node 21.

The P-channel load transistor Q3 is optional, but is desirable for decreasing the gain of inverter stage 200. Decreasing the gain of the inverter stage 200 allows the oscillating frequency of the ring oscillator 12 to slow down without an excessive capacitive load, which would increase operating current. Load transistor Q3 has a source coupled to VDD, a drain coupled to the source of the second P-channel transistor Q5, and a gate coupled to a first source of bias voltage VBIAS1. The value of the first bias voltage is set to $VDD - V_{TP} + \Delta$, wherein $V_{TP}$ is the threshold voltage of the load P-channel transistor Q3, and $\Delta$ is a predetermined incremental voltage. The incremental voltage is set to slightly bias load transistor Q3 to a high-resistance (low current) operating point. Similarly, the N-channel load transistor Q4 is optional but desirable for decreasing inverter gain. Load transistor Q4 has a source coupled to VSS, a drain coupled to the source of the second N-channel transistor Q6, and a gate coupled to a second source of bias voltage VBIAS2. The value of the second bias voltage is set to $VSS + V_{TN} + \Delta$, wherein $V_{TN}$ is the threshold voltage of the load N-channel transistor Q4, and $\Delta$ is a predetermined incremental voltage. The incremental voltage is set to bias load transistor Q4 at the high-resistance operating point, which need not necessarily be the same as for load transistor Q3.

For normal CMOS logic levels, the value of the first source of supply voltage, VDD, is about five volts and the value of the second source of supply voltage, VSS, is about zero volts. These values can change, especially if high-density, sub-micron transistor geometries are used. For example, if submicron geometries are used, VDD is typically set to 3.3 volts to reduce electric field. Other values of VDD and VSS can be used to accommodate non-standard CMOS logic levels. Depending upon the application, VDD can have a range of voltage between two and six volts.

Figure 6:
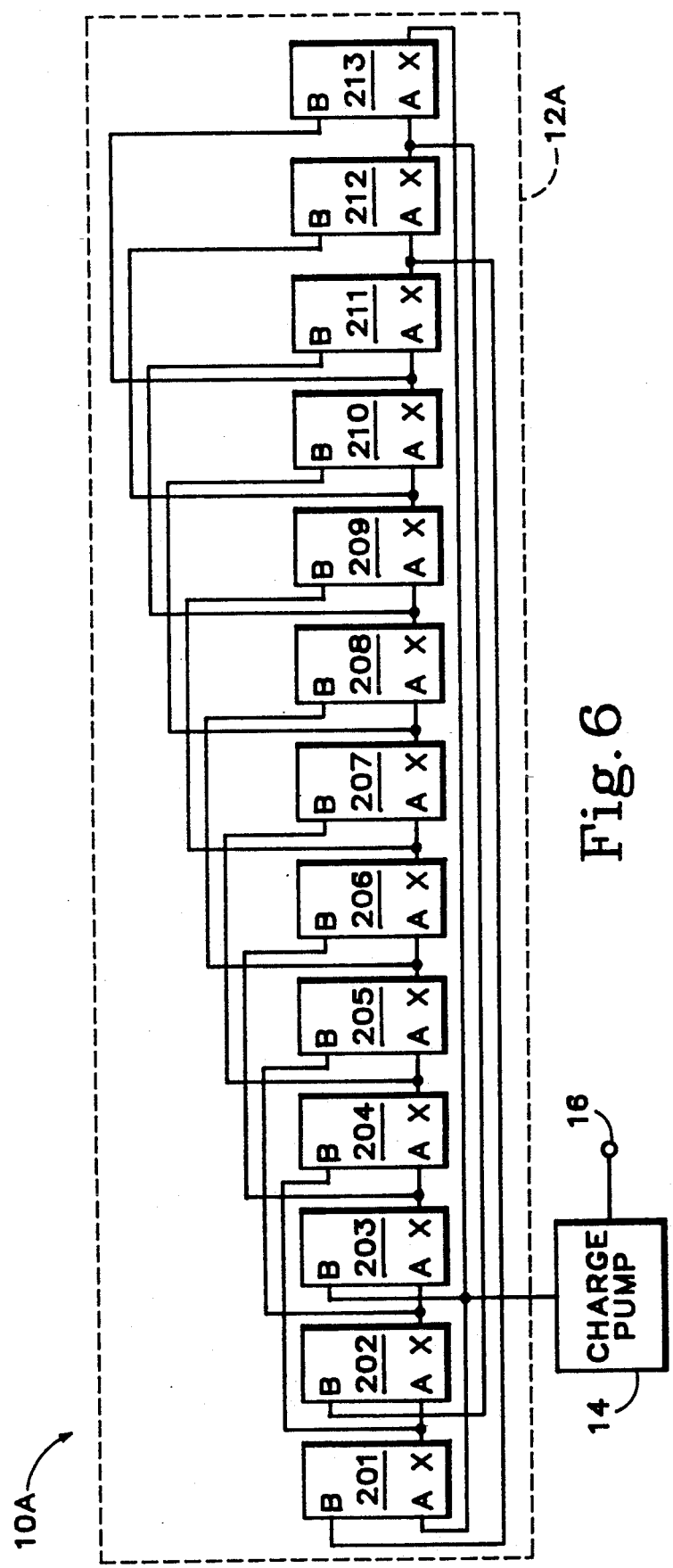
FIGS. 6-8 are block diagrams of three embodiments of charge pump systems according to the present invention.

A first embodiment of a ring oscillator 12A for use in a charge pump system 10A is shown in FIG. 6. Ring oscillator 12A includes an odd number of inverter stages 201-213 each having a primary A input, a secondary B input, and an X output. Thirteen inverter stages are shown in FIG. 6, but any odd number can be used. The X output of each inverter stage 201-213 is coupled to the primary A input of a following inverter stage in a serially-connected ring fashion. The X output of the last inverter stage 213 is coupled to the primary A input of the first inverter stage 201, which forms an oscillating signal output coupled to charge pump 14. The output 16 of charge pump 14 provides the negative bias voltage for biasing the substrate of an integrated circuit containing the charge pump system 10A. The secondary B input of each inverter stage 201-213 is coupled to the X output of an Mth preceding inverter stage, wherein M is an odd integer greater or equal to three. In the ring oscillator 12A of FIG. 6, M is equal to three. Thus, the secondary B input of inverter stage 208 is coupled to the X output of inverter stage 205. Similarly, the secondary B input of inverter stage 207 is coupled to the X output of inverter stage 204. Since the inverter stages 201-213 are coupled in a ring fashion, all inverter stages are similarly coupled. For example the secondary B input of inverter stage 201 is coupled to the X output of inverter stage 211.

Figure 9:
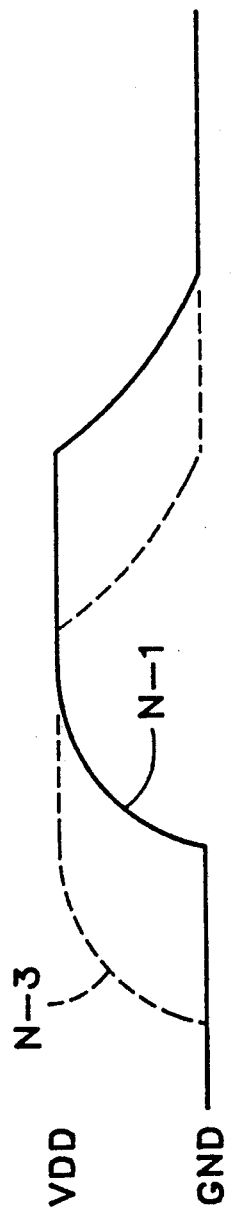
FIG. 9 illustrates the oscillating waveforms provided by the charge pump system shown in FIG. 6.

The operation of ring oscillator 12A is best seen in FIG. 9. The solid waveform is the square wave formed by the ring oscillator. The N−1 waveform represents the wavefront at an (N−1)th inverter stage output (primary A input to an Nth inverter stage) and the N−3 waveform represent the wavefront at an (N−3)th inverter stage output (secondary B input to the Nth inverter stage). Recalling the operation of an inverter stage 200 described previously and shown in FIG. 5, when the N−3 waveform (B input) is at a logic high level and the N−1 waveform (A input) is at a logic low level, there is no current flow within the inverter stage.

When the N−3 and N−1 waveforms have both reached the logic high level, current flows from the output into N-channel transistors Q2 and Q6 from the load (the input of the succeeding inverter stage), and the output of the inverter changes logic state. However, P-channel transistors Q1 and Q5 are both off and therefore no undesirable crossing-current can flow from VDD to VSS.

Figure 7:
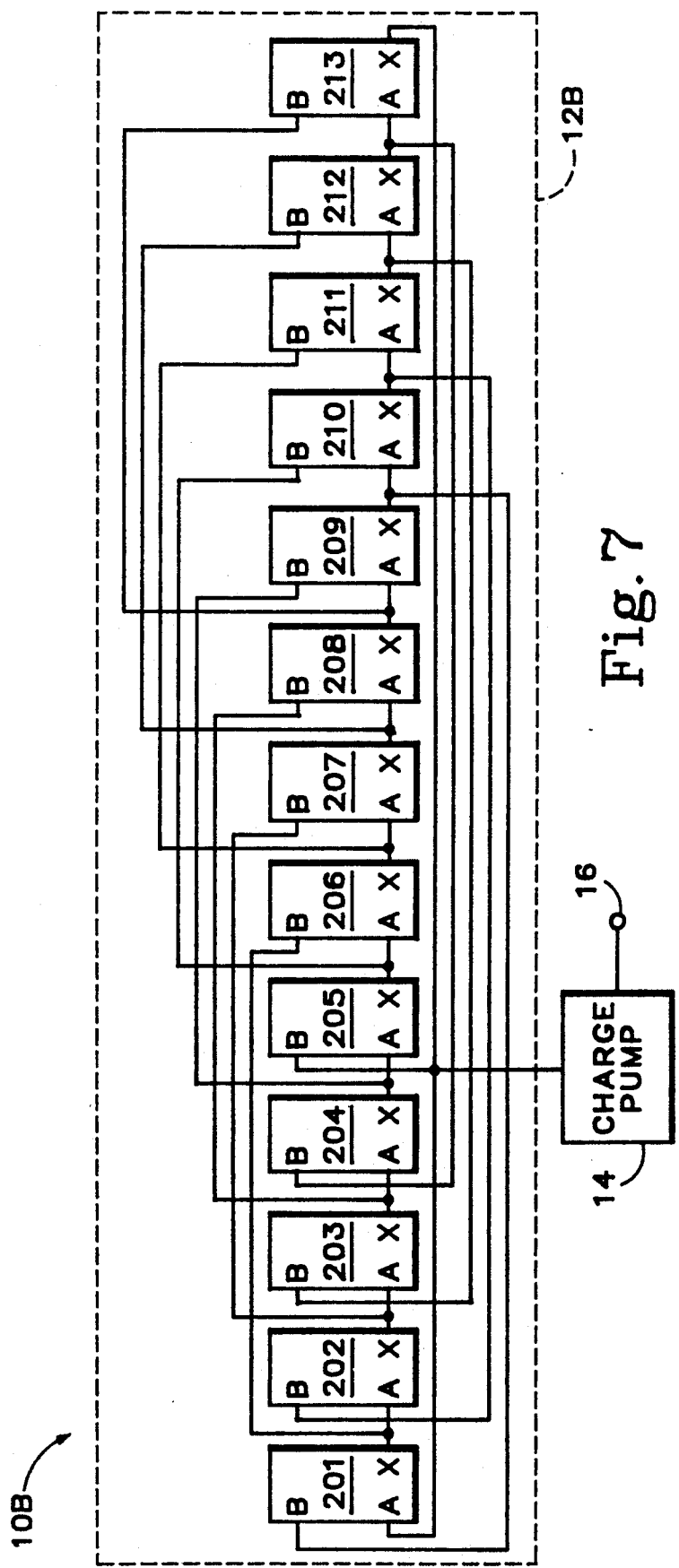

An alternative embodiment, ring oscillator 12B is shown in FIG. 7 in which M is equal to five. The secondary B input of inverter stage 208 is coupled to the X output of inverter stage 203. Similarly, the secondary B input of inverter stage 207 is coupled to the X output of inverter stage 202. As in the previous embodiment, inverter stages 201-213 are coupled in a ring fashion, and therefore all inverter stages are similarly coupled. Thus, the secondary B input of inverter stage 201 is coupled to the X output of inverter stage 209.

Figure 10:
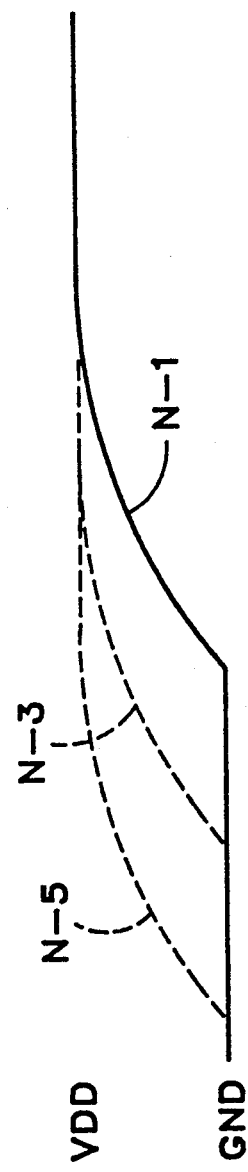
FIG. 10 illustrates the oscillating waveforms provided by the charge pump system shown in FIG. 7.

The operation of ring oscillator 12B is best seen in FIG. 10. The N−1 waveform represents the wavefront at an (N−1)th inverter stage output (primary A input to an Nth inverter stage) and the N−5 waveform represents the wavefront at an (N−5)th inverter stage output (secondary B input to the Nth inverter stage). The N−3 waveform represents the wavefront at an (N−3)th inverter stage output that is not coupled in any way to the current or Nth inverter stage. When the N−5 waveform (B input) is at a logic high level and the N−1 waveform (A input) is at a logic low level, there is no current flow within the inverter stage. When the N−5 and N−1 waveforms have both reached the logic high level, current flows from the output into N-channel transistors Q2 and Q6 from the load, and the output of the inverter changes logic state. As in the previous embodiment, P-channel transistors Q1 and Q5 are both off and no undesirable crossing-current can flow from VDD to VSS.

Figure 1:
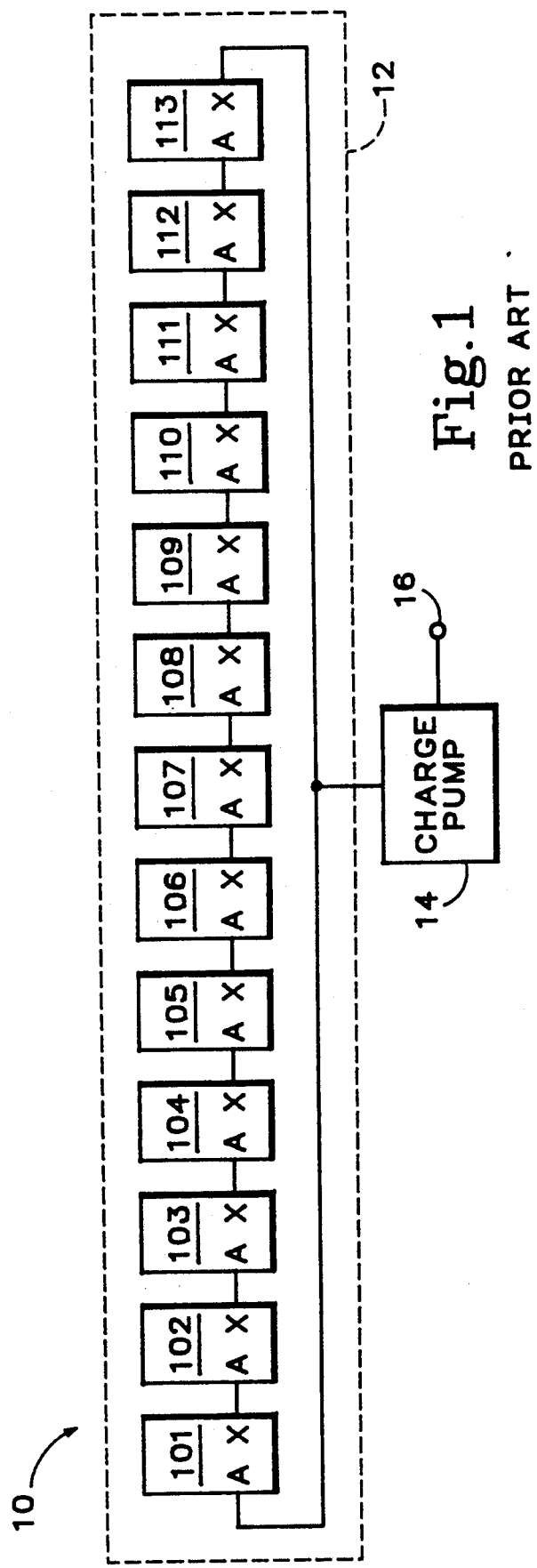
FIG. 1 is a simplified block diagram of a prior art charge pump system including a ring oscillator and a charge pump.
Figure 2:
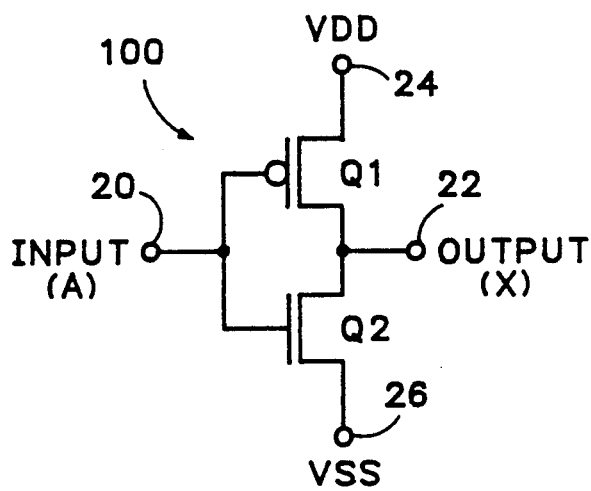
FIGS. 2-3 are schematic diagrams of prior art inverters used in the ring oscillator of FIG. 1.
Figure 3:
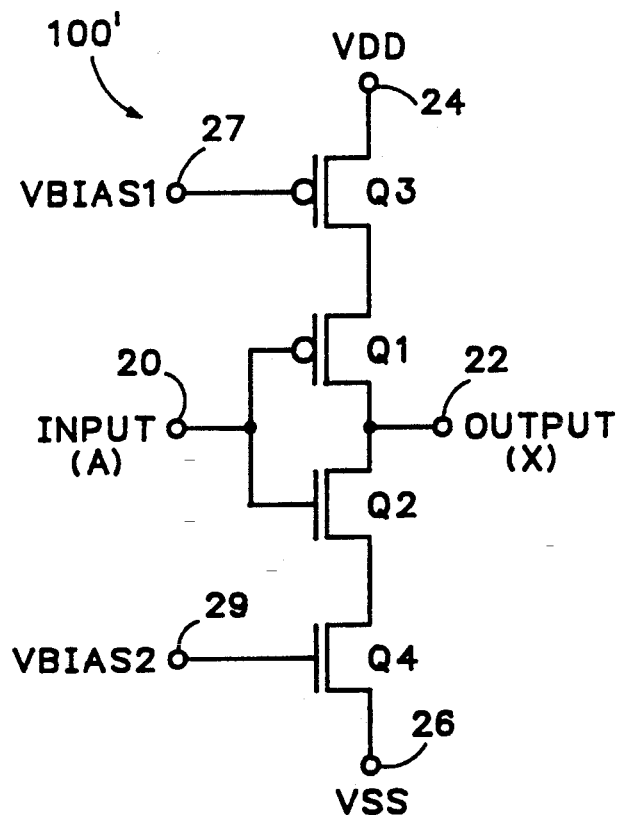
Figure 4:
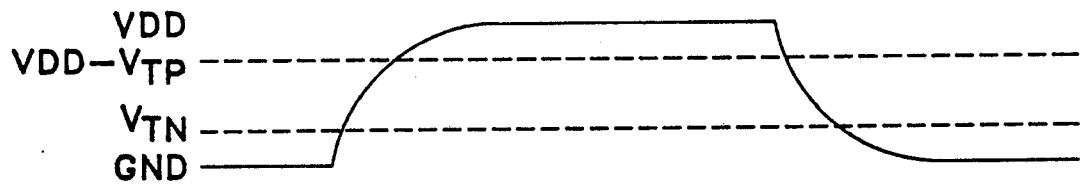
FIG. 4 illustrates the oscillating waveform provided by the ring oscillator of FIG. 1.

The embodiment of FIG. 7 is desirable for ring oscillators having long rise and fall times on the leading and trailing edges of the oscillating output waveform. Referring again to FIG. 10, it can be seen that the N−3 waveform is not appropriate for switching the Nth inverter stage. If the N−3 waveform is used, a period of time will exist wherein all transistors in the inverter stage are biased on, leading to undesirable crossing-current similar to that described in conjunction with the prior art inverter stages 100 and 100' shown in FIGS. 2 and 3. Note that the N−5 waveform is at a logic high level prior to the point at which the N−1 waveform begins to switch. No period of time exists in which all inverter stage transistors are biased on and therefore no crossing-current can flow.

Figure 8:
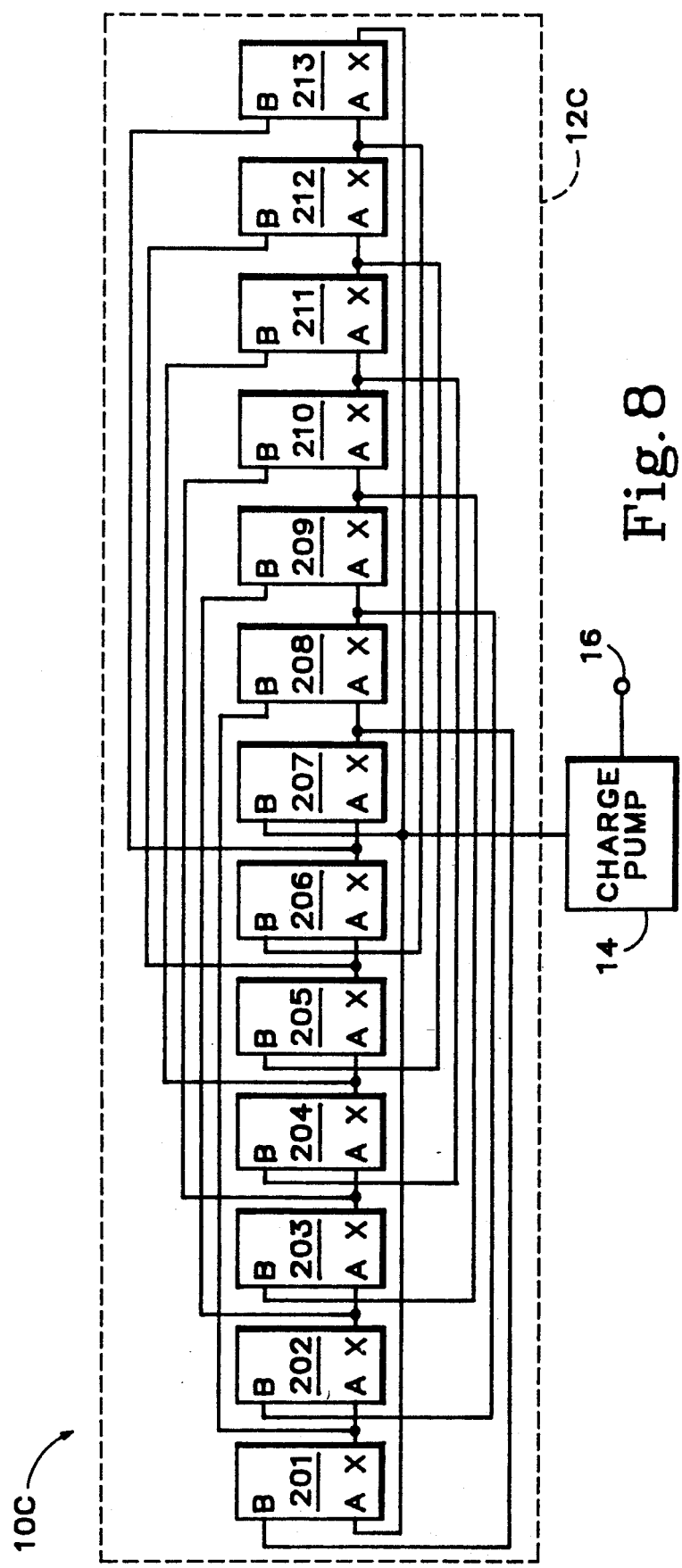

The above operation can be further extended depending upon the rise and fall time of the ring oscillator. For example, a ring oscillator 10C in which M is equal to seven is shown in FIG. 8. The secondary B input of inverter stage 209 is coupled to the X output of inverter stage 202. Similarly, the secondary B input of inverter stage 208 is coupled to the X output of inverter stage 201. As in the previous embodiment, inverter stages 201-213 are coupled in a ring fashion, and therefore all inverter stages are similarly coupled. The secondary B input of inverter stage 201 is coupled to the X output of inverter stage 207. The operation of ring oscillator 10C is very similar to that of ring oscillators 10A and 10B described above, and whose output waveforms are shown in FIGS. 9 and 10. The only difference is that it may be desirable to use ring oscillator 10C in those cases where the oscillating waveform has extremely long rise and fall times due to the nature of the devices used, parasitic capacitance, and other factors. In the final analysis, the exact configuration of the ring oscillator should be tailored to the characteristics of the oscillating output waveform. The rise and fall time can be measured and a corresponding odd M number selected for proper A and B input timing such that no crossing-current can flow.

The operation of ring oscillators 10A-10C has proceeded with an analysis of the rise time. It is apparent to those skilled in the art that the analysis of the fall time portion of the waveform is very similar and need not be explicitly conducted. The same elimination of zero crossing current occurs during the fall time of the oscillating output waveform.

It is desirable to include in ring oscillators 10A-10C means for providing initial voltage conditions at the output of each of the inverter stages 201-213. A single P-channel or N-channel transistor can be coupled between each output and ground or VDD. An initial pattern of alternating logic levels is then loaded at the gates of each transistor, and therefore correspondingly at the outputs of the inverter stages. Once the pattern is established, the transistors are turned off and the ring oscillator can be activated. Other initial condition patterns can be used, and other means for establishing those patterns can also be used.

Having described and illustrated the principles of the invention in a preferred embodiment thereof, it is apparent to those skilled in the art that the invention can be modified in arrangement and detail without departing from such principles.

I therefore claim all modifications and variation coming within the spirit and scope of the following claims:

1. A ring oscillator for use in a charge pump comprising N inverter stages each having a primary input, a secondary input, and an output, wherein N is an odd integer, the output of each inverter stage is coupled to the primary input of a following inverter stage in a serially-connected ring fashion such that the output of a last inverter stage is coupled to the primary input of a first inverter stage and forms an oscillating signal output, and the secondary input of each stage is coupled to the output of an Mth preceding inverter stage, wherein M is an odd integer greater or equal to three.

2. A ring oscillator as in claim 1 in which M is equal to three.

3. A ring oscillator as in claim 1 in which M is equal to five.

4. A ring oscillator as in claim 1 in which M is equal to seven.

5. A ring oscillator as in claim 1 further comprising means for providing initial voltage conditions at the output of each of the inverter stages.

6. A ring oscillator as in claim 1 further comprising means for impressing an initial pattern of alternating logic levels at the outputs of the inverter stages.

7. A ring oscillator as in claim 1 in which each inverter stage comprises:

means for inverting the logic signal at the output if both the primary and secondary inputs are switched from a first logic state to a second logic state; and means for inhibiting zero crossing current if the primary and secondary inputs are at different logic states.

8. A ring oscillator as in claim 1 in which each inverter stage comprises:
   a first P-channel transistor having a gate, a drain, and a source;
   a first N-channel transistor having a gate, a drain, and a source, the gates of the first P-channel and N-channel transistors being coupled together to form the primary input, and the drains of the first P-channel and N-channel transistors being coupled together to form the output;
   a second P-channel transistor having a gate, a drain coupled to, the source of the first P-channel transistor, and a source coupled to a first source of supply voltage;
   a second N-channel transistor having a gate, a drain coupled to the source of the first N-channel transistor; and a source coupled to a second source of supply voltage, the gates of the second P-channel and N-channel transistors being coupled together to form the secondary input.

9. A ring oscillator as in claim 8 in which the inverter further comprises:
   a first load interposed between the source of the second P-channel transistor and the first source of supply voltage; and
   a second load interposed between the source of the second N-channel transistor and the second source of supply voltage.

10. A ring oscillator as in claim 9 in which the first load comprises a third P-channel transistor having a source coupled to the first source of supply voltage, a drain coupled to the source of the second P-channel transistor, and a gate coupled to a first source of bias voltage.

11. A ring oscillator as in claim 10 in which the value of the first bias voltage is set to $VDD - V_{TP} + \Delta$, wherein VDD is the value of the first source of supply voltage, $V_{TP}$ is the threshold voltage of the third P-channel transistor, and $\Delta$ is a predetermined incremental voltage.

12. A ring oscillator as in claim 9 in which the second load comprises a third N-channel transistor having a source coupled to the second source of supply voltage, a drain coupled to the source of the second N-channel transistor, and a gate coupled to a second source of bias voltage.

13. A ring oscillator as in claim 12 in which the value of the second bias voltage is set to $VSS + V_{TN} + \Delta$, wherein VSS is the value of the second source of supply voltage, $V_{TN}$ is the threshold voltage of the third N-channel transistor, and $\Delta$ is a predetermined incremental voltage.

14. A ring oscillator as in claim 8 in which the value of the first source of supply voltage ranges from about two volts to six volts and the value of the second source of supply voltage is about zero volts.

15. A method of generating an oscillating signal that minimizes power consumption due to zero-crossing current, the method comprising the steps of:
   providing a ring oscillator for use in a charge pump including N inverter stages each having a primary input, a secondary input, and an output, wherein N is an odd integer;
   coupling the output of each inverter stage to the primary input of a following inverter stage in a serially-connected ring fashion;
   coupling the output of a last inverter stage to the primary input of a first inverter stage to form an output for generating the oscillating signal; and
   coupling the secondary input of each stage to the output of an Mth preceding inverter stage, wherein M is an odd integer greater or equal to three.

16. The method of claim 15 further comprising the step of setting M equal to three.

17. The method of claim 15 further comprising the step of setting M equal to five.

18. The method of claim 15 further comprising the step of setting M equal to seven.

19. The method of claim 15 further comprising the step of providing initial voltage conditions at the output of each of the inverter stages.

20. The method of claim 15 further comprising the step of impressing an initial pattern of alternating logic levels at the outputs of the inverter stages.

* * * * *

Adverse Decisions In Interference

Patent No. 5,182,529, Wen-Foo Chern, ZERO CROSSING-CURRENT RING OSCILLATOR FOR SUBSTRATE CHARGE PUMP, Interference No. 104,624, final judgment adverse to the patentee rendered January 7, 2002, as to claims 1-20.
*(Official Gazette February 12, 2002)*